(12) United States Patent
Kawanabe et al.

(10) Patent No.: US 12,014,903 B2
(45) Date of Patent: Jun. 18, 2024

(54) PLASMA PROCESSING APPARATUS

(71) Applicant: Hitachi High-Tech Corporation, Tokyo (JP)

(72) Inventors: Tetsuo Kawanabe, Tokyo (JP); Motohiro Tanaka, Tokyo (JP); Takahiro Sakuragi, Tokyo (JP); Kohei Sato, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/958,313

(22) PCT Filed: Jul. 18, 2019

(86) PCT No.: PCT/JP2019/028262
§ 371 (c)(1),
(2) Date: Jun. 26, 2020

(87) PCT Pub. No.: WO2020/121581
PCT Pub. Date: Jun. 18, 2020

(65) Prior Publication Data
US 2022/0415618 A1    Dec. 29, 2022

(51) Int. Cl.
*H01J 37/32* (2006.01)
(52) U.S. Cl.
CPC .. *H01J 37/32449* (2013.01); *H01J 37/32082* (2013.01); *H01J 37/32678* (2013.01); *H01J 2237/3343* (2013.01)
(58) Field of Classification Search
USPC .................................. 118/715; 156/345.34
See application file for complete search history.

(56) References Cited

U.S. PATENT DOCUMENTS

2002/0164883 A1* 11/2002 Ohmi ................ H01L 21/02274
                                                              438/726
2007/0209759 A1    9/2007 Miya et al.
2009/0130335 A1    5/2009 Okumura et al.
(Continued)

FOREIGN PATENT DOCUMENTS

JP          H11172448 A    6/1999
JP          200422595 A    1/2004
(Continued)

OTHER PUBLICATIONS

Search Report dated Oct. 8, 2019 in corresponding International Application No. PCT/JP2019/028262.
(Continued)

*Primary Examiner* — Ram N Kackar
(74) *Attorney, Agent, or Firm* — Miles & Stockbridge, P.C.

(57) ABSTRACT

In a plasma processing apparatus including a plasma processing chamber disposed in a vacuum chamber, a sample stage disposed in the plasma processing chamber and on which a sample is placed, in the vacuum chamber, a second shower plate disposed above the sample stage, a first shower plate disposed above the second shower plate, and a dielectric window disposed above the first shower plate, first gas is supplied from a first gas supply unit to a space between the dielectric window and the first shower plate, and second gas is supplied from a second gas supply unit to a space between the first shower plate and the second shower plate.

6 Claims, 12 Drawing Sheets

(56) References Cited

U.S. PATENT DOCUMENTS

2013/0164911 A1    6/2013   Ito et al.
2014/0099794 A1    4/2014   Ingle et al.
2015/0380281 A1   12/2015   Sriraman et al.
2018/0096821 A1    4/2018   Lubomirsky

FOREIGN PATENT DOCUMENTS

| | | | | |
|---|---|---|---|---|
| JP | 2006324400 | A | 11/2006 | |
| JP | 2007242777 | A | 9/2007 | |
| JP | 2010278207 | * | 12/2010 | ......... H01L 21/3065 |
| JP | 5308664 | B2 | 10/2013 | |
| JP | 2015532016 | A | 11/2015 | |
| JP | 201621564 | A | 2/2016 | |
| JP | 2016136553 | A | 7/2016 | |
| TW | 201244841 | A | 11/2012 | |
| TW | 201327661 | A | 7/2013 | |
| TW | 201419401 | A | 5/2014 | |

OTHER PUBLICATIONS

Written Opinion dated Oct. 8, 2019 in corresponding International Application No. PCT/JP2019/028262.
Office Action dated Nov. 9, 2020 in Taiwanese Application No. 109114145.
Office Action dated May 27, 2021 in Korean Application No. 10-2020-7009884.

* cited by examiner

[FIG. 1]
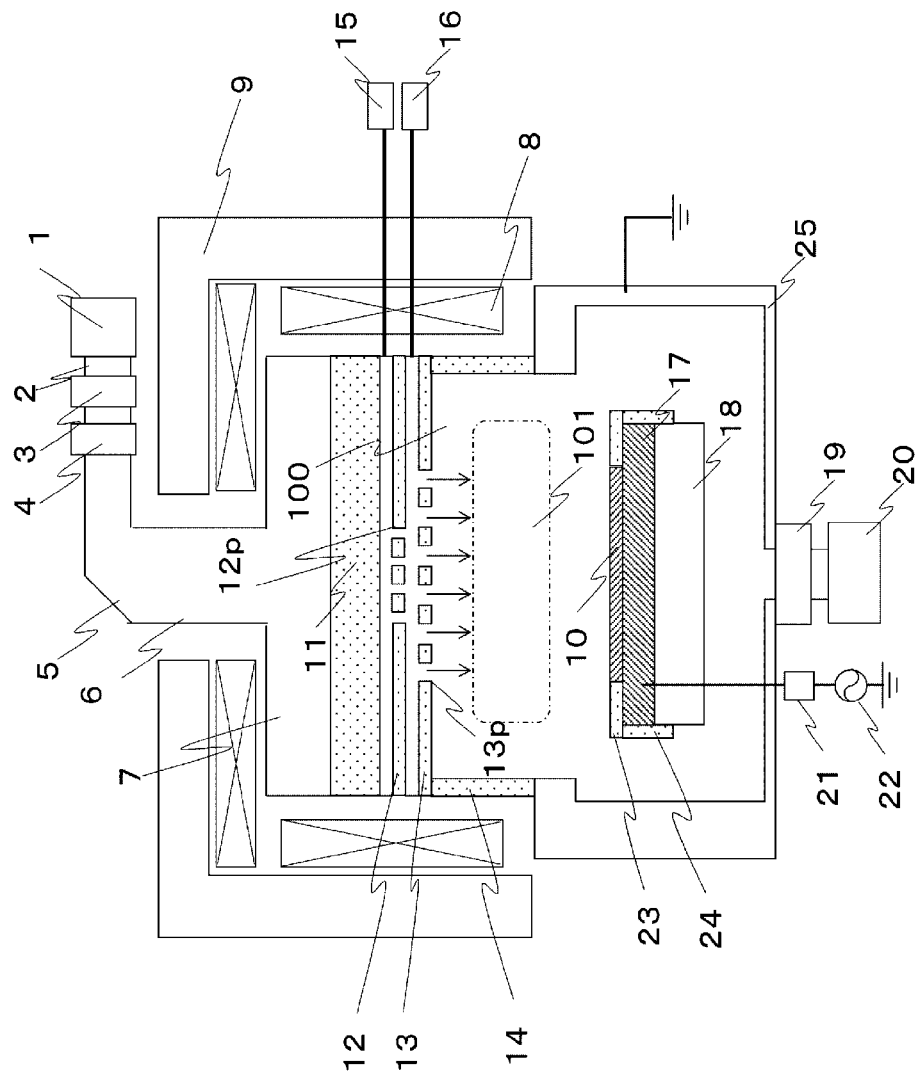

[FIG. 2A]
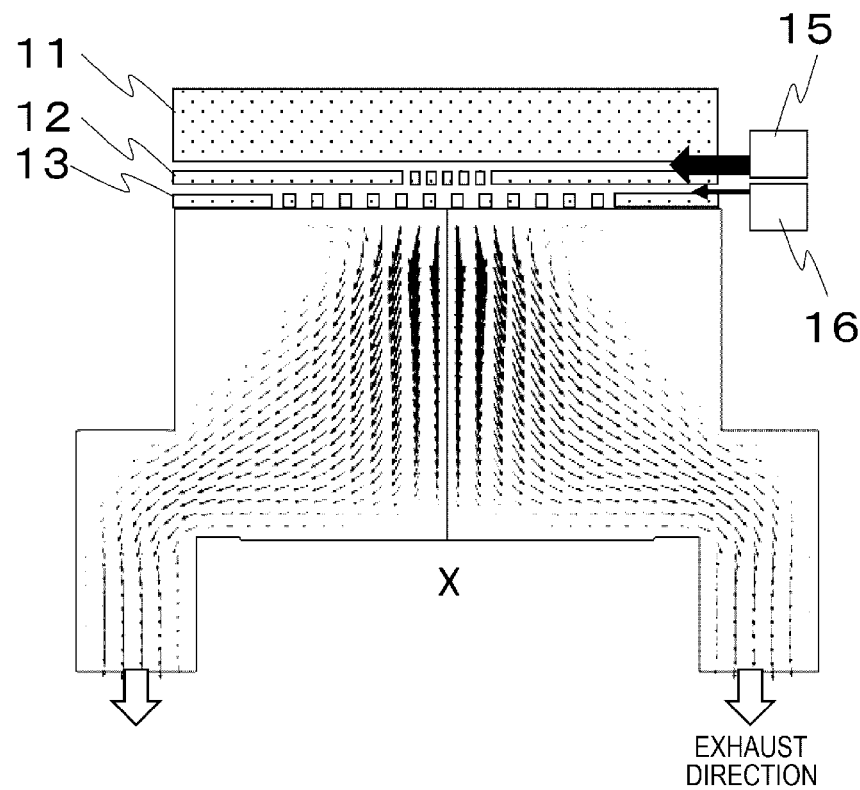
EXHAUST DIRECTION
[FIG. 2B]
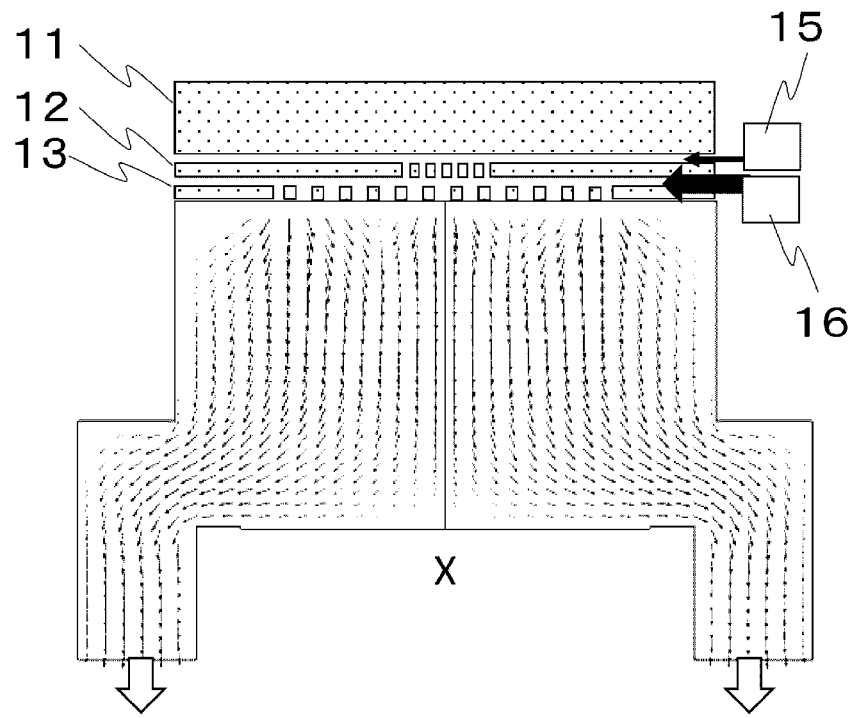

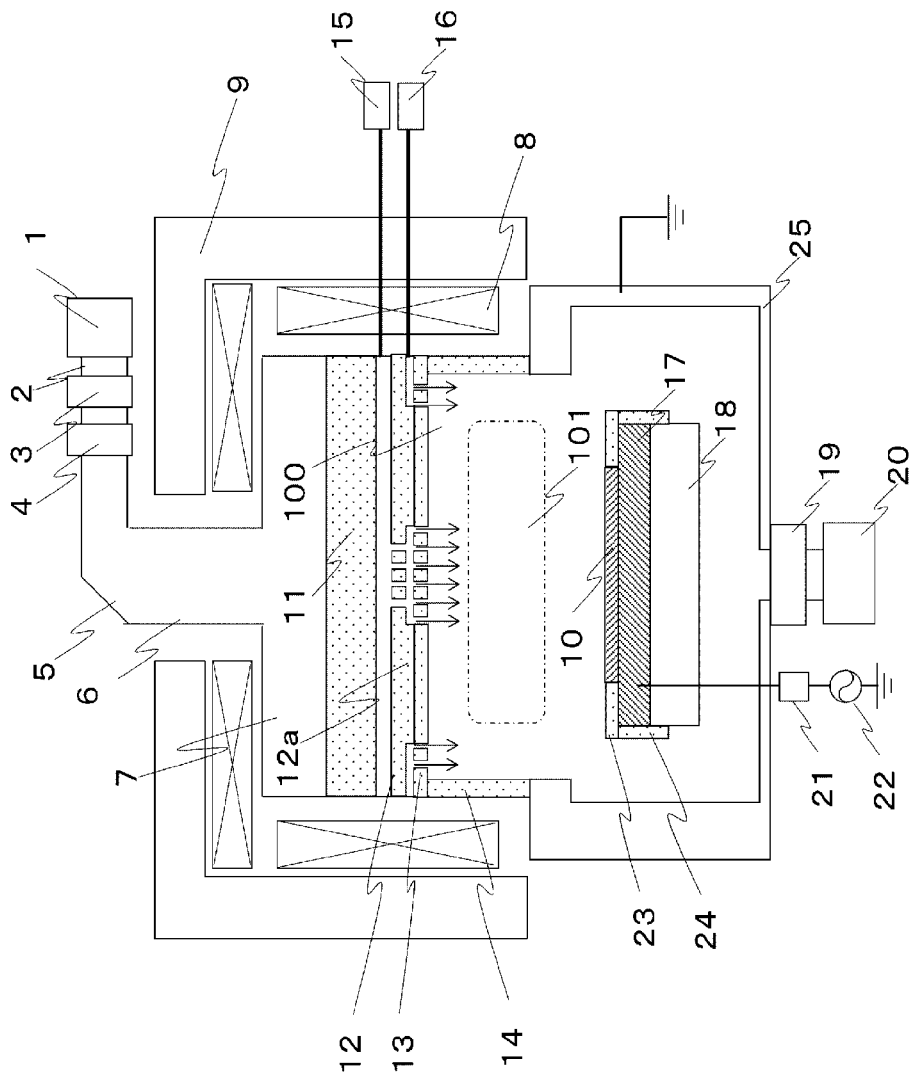
[FIG. 3]

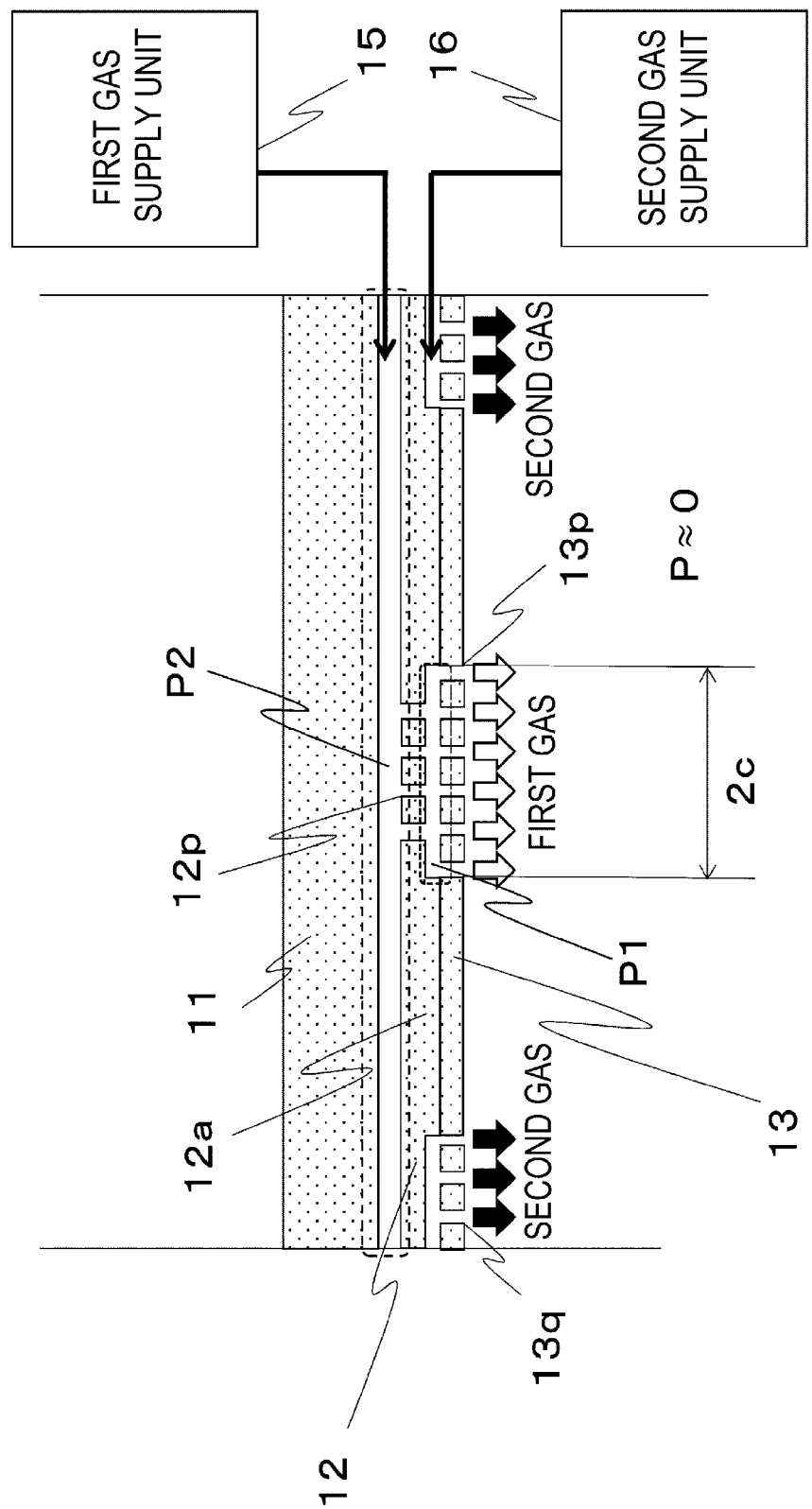
[FIG. 4]

[FIG. 5A]
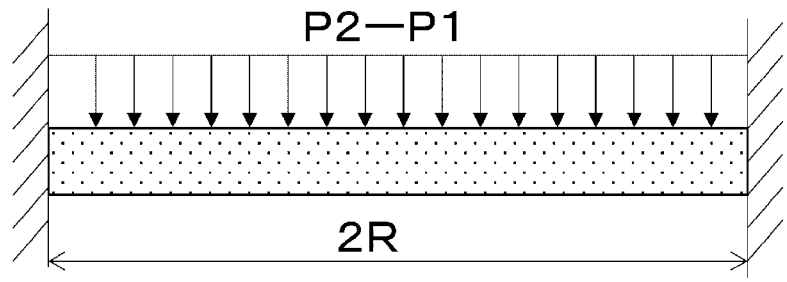
[FIG. 5B]
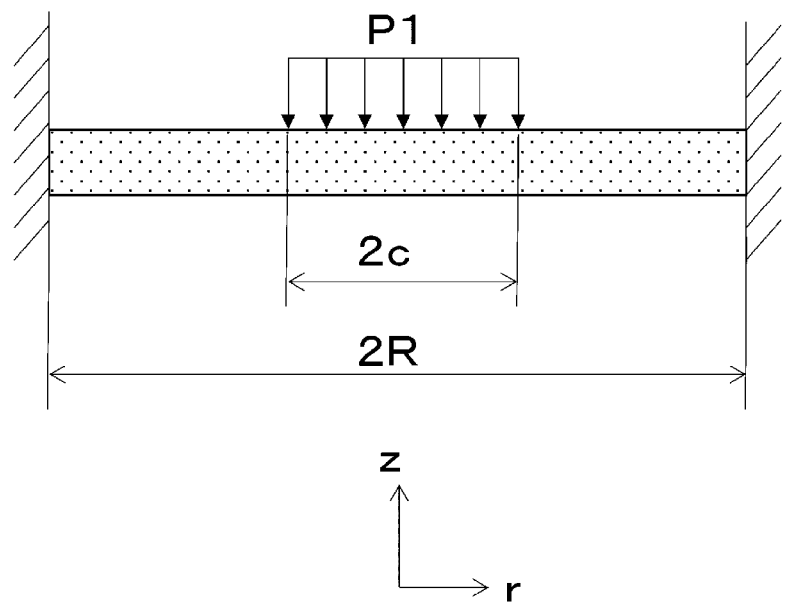

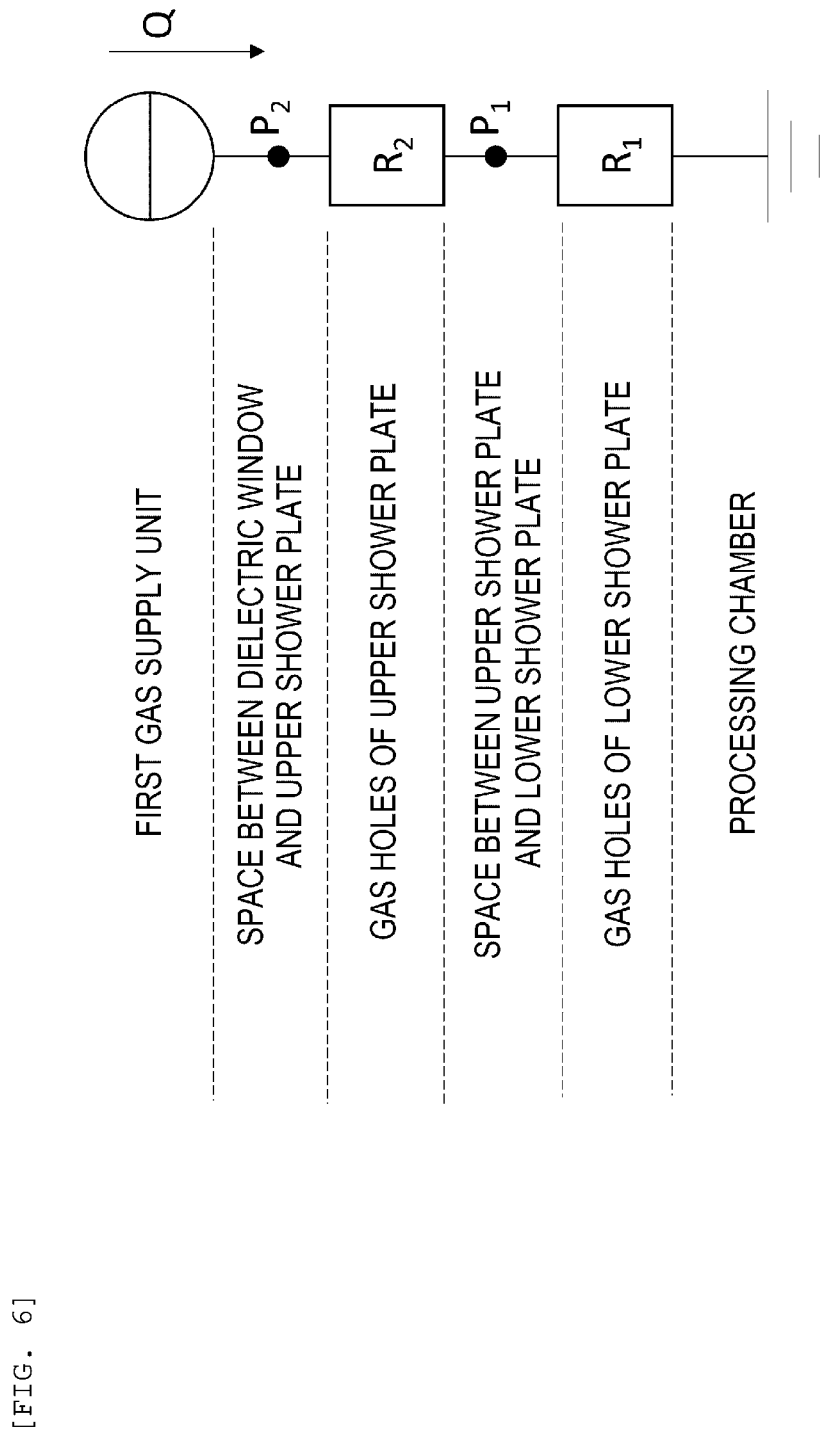
[FIG. 6]

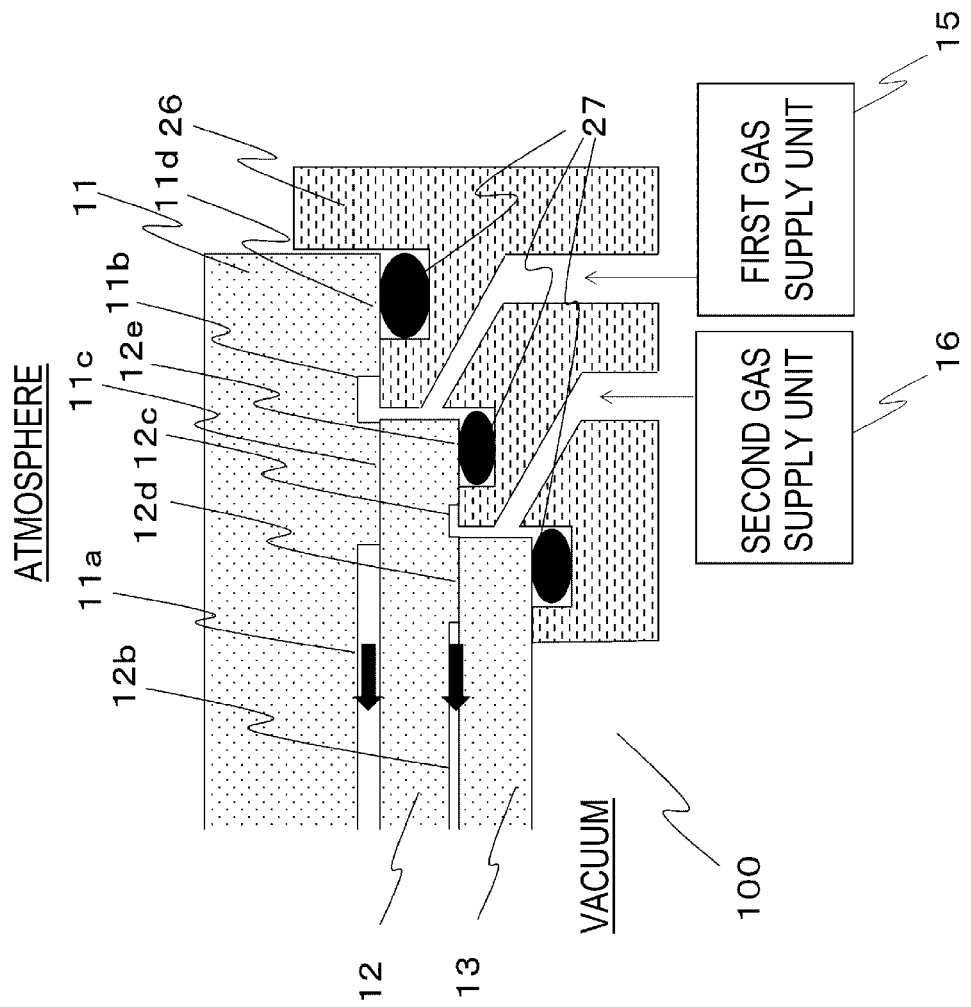
[FIG. 7]

[FIG. 8A]
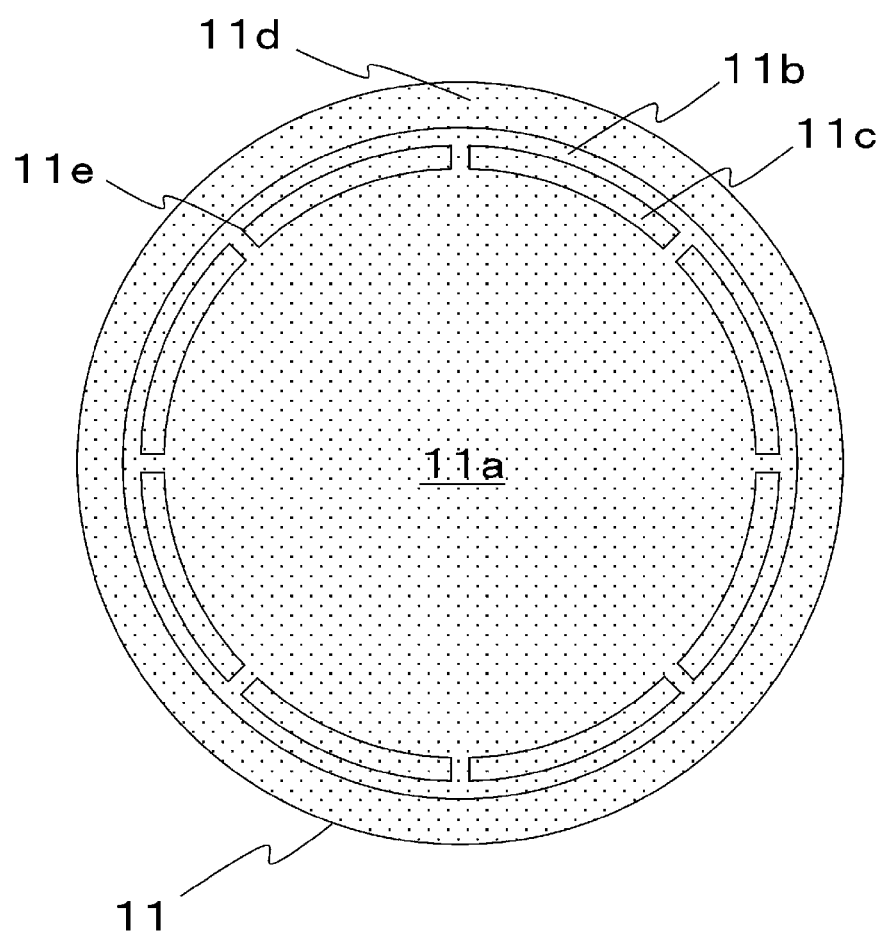

[FIG. 8B]
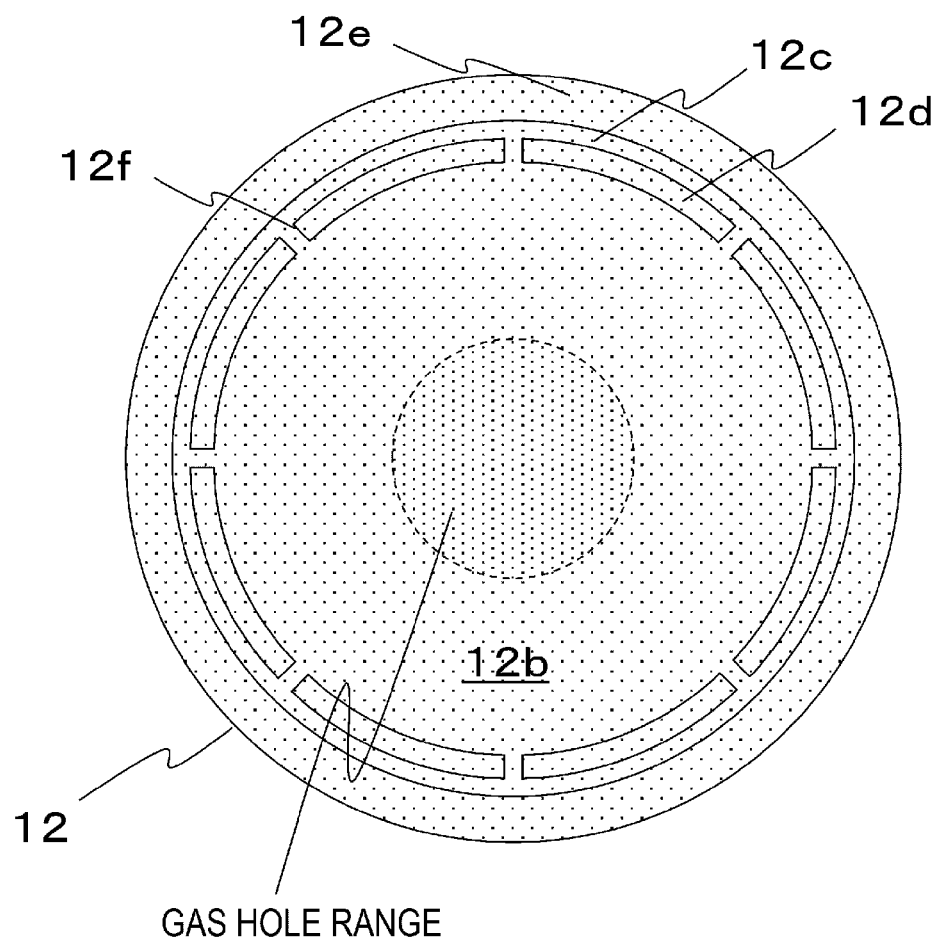
GAS HOLE RANGE

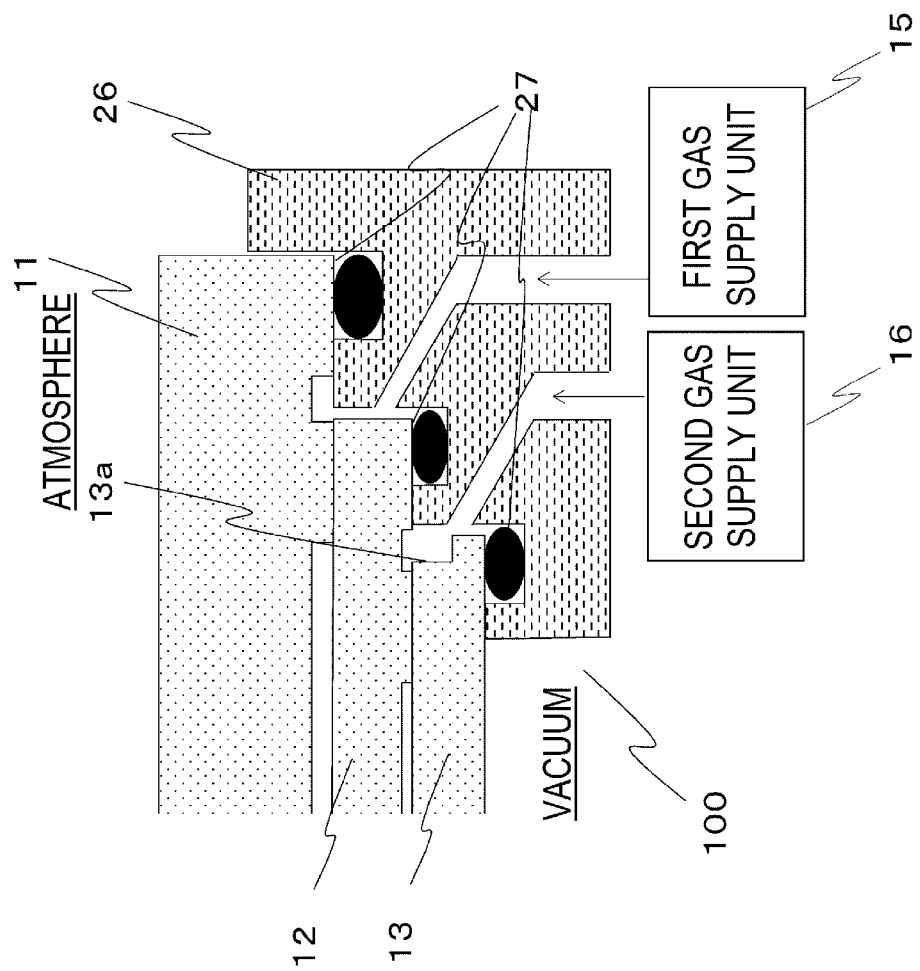

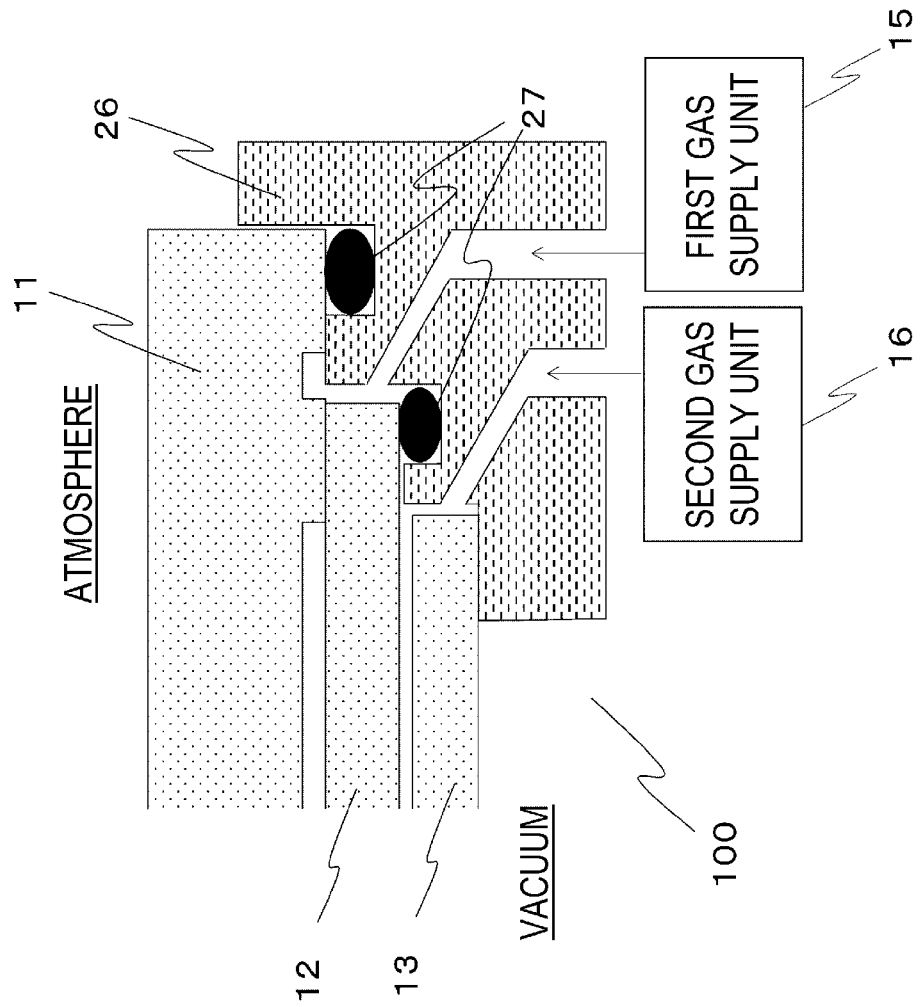
[FIG. 10]

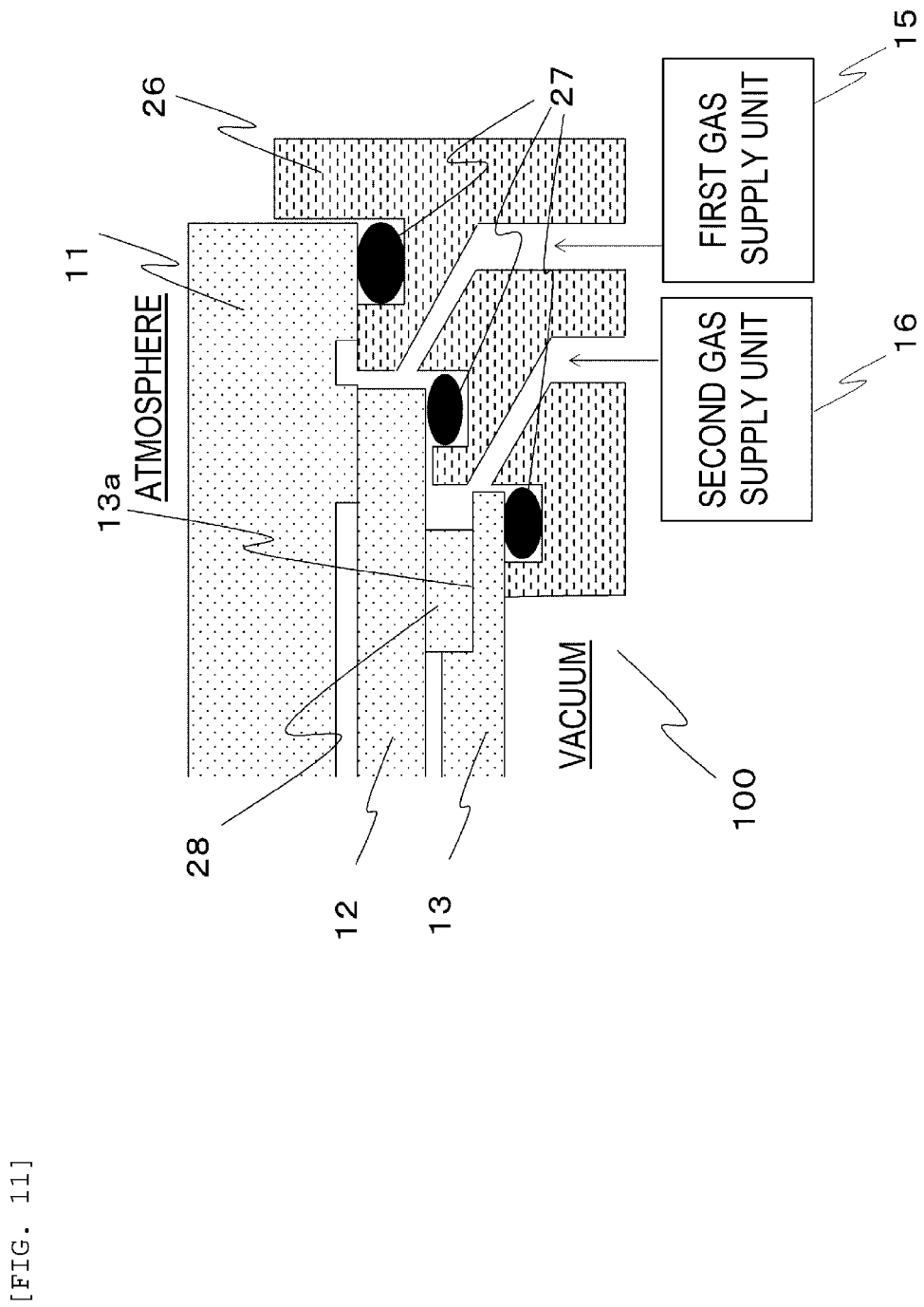
[FIG. 11]

PLASMA PROCESSING APPARATUS

TECHNICAL FIELD

The present invention relates to a plasma processing apparatus.

BACKGROUND ART

In a manufacturing step of a semiconductor device, there is a demand for miniaturization and integration of components provided in the semiconductor apparatus. For example, in an integrated circuit or a nano-electromechanical system, nanoscaling of a structure is being further promoted. In such a semiconductor device manufacturing step, plasma processing such as plasma etching, plasma chemical vapor deposition (CVD), and plasma asking is widely used.

In general, in the manufacturing step of the semiconductor device, a lithography technique is used to form a fine pattern. In this technique, a pattern of a device structure is applied on a resist layer, and a substrate exposed by the pattern of the resist layer is selectively removed by etching. In a subsequent processing step, as long as another material is deposited in an etching region, the integrated circuit can be formed.

In an etching step in the most advanced semiconductor device manufacturing, high dimensional accuracy of an atomic layer level is required for a critical dimension (CD) of a processing dimension width. Further, good processing uniformity is required such that the high dimensional accuracy can be ensured in a wafer surface.

As a method of generating plasma in a plasma etching apparatus, there are known methods such as electron cyclotron resonance (ECR), inductive coupling, and capacitive coupling. The ECR method is a plasma generation method using a resonance phenomenon in which a rotation frequency of electrons orbiting a magnetic force line matches a microwave frequency. The ECR plasma generation method has a feature that ion flux distribution in the wafer surface can be controlled by changing a generation region of ECR plasma by controlling a coil magnetic field.

Herein, in order to ensure uniformity in the wafer surface in the plasma etching processing, it is necessary to adjust distribution of incident flux onto the wafer, such as ions or radicals contributing to the etching, and a reaction product from the wafer. In a plasma etching apparatus of ECR type using microwaves, in order to ensure the uniformity of the ion flux distribution on the wafer, position control of a 875 G isomagnetics field surface (ECR surface) corresponding to the plasma generation region, which is based on control of a current value of an electromagnetic coil, and ion transport control based on adjustment of a direction of the magnetic force lines is often used.

Since diffusion of ions as charged particles in a direction perpendicular to the magnetic force line is controlled, the flux to the wafer can be controlled to some extent by changing the direction of the magnetic force line. On the other hand, transport of electrically neutral radicals and the reaction products cannot be controlled by an external magnetic field. Non-uniform density distribution of the radicals and the reaction products on the wafer is a factor of deterioration of the uniformity of the processing dimension in the wafer surface, and thus needs to be corrected.

For example, there is a technique of controlling a gas flow field in an apparatus as one of methods of making the non-uniform density distribution of the reaction products uniform on the wafer. For example, PTL 1 discloses a configuration in which a ceramic shower plate that supplies gas into an inductively coupled plasma processing apparatus, and a gas injector disposed in a central portion are provided.

According to the technique of PTL 1, distribution of a flow velocity in the apparatus can be adjusted by adjusting flow rates of the gas supplied to the central gas injector and the ceramic shower plate, respectively. For example, when the gas is supplied from the central gas injector, a high flow velocity can be implemented on a central axis of the apparatus, and when the gas is supplied from the ceramic shower plate, a uniform gas flow can be implemented in the apparatus. As a result, the transport of the reaction product generated from the wafer is adjusted by the gas flow, which contributes to making the density distribution of the reaction product on the wafer uniform.

CITATION LIST

Patent Literature

PTL 1: JP-A-2016-21564
PTL 2: JP-A-2007-242777
PTL 3: JP-A-2016-136553

SUMMARY OF INVENTION

Technical Problem

However, in the plasma etching apparatus of ECR type, since the microwaves are injected on the central axis of the apparatus to obtain an axially symmetric microwave electric field, when a structure such as the gas injector or a pipe toward the gas injector is arranged at the central portion of the apparatus, axial symmetry of the microwave electric field distribution is disturbed. As a result, there is a problem that deviation occurs in the plasma density distribution, and the processing uniformity is deteriorated. In order to avoid such a problem and adjust the gas flow velocity distribution in the plasma etching apparatus of ECR type, one idea is to use a shower plate in which gas hole arrangement is optimized so as to obtain a desired density distribution of the reaction product.

For example, when a shower plate in which the hole arrangement is concentrated in a central portion is used, since the gas is supplied concentratedly on the central axis of the apparatus, the gas flow velocity at a central portion of the wafer can be increased. On the other hand, when a shower plate in which the gas holes are arranged on an entire surface is used, a relatively uniform gas flow can be formed in the apparatus. However, in an etching step requiring various processing conditions such as etching of a multilayer film, the plasma processing needs to be performed while the shower plate with the optimized hole arrangement is exchanged for each processing condition, and production efficiency is significantly reduced when the plasma processing apparatus is stopped every time the shower plate is replaced.

Further, as a method of making the density distribution of the radicals uniform, for example, a technique of supplying different kinds of gas from the vicinity of the central axis and an outer circumference of the apparatus is well known. In order to control radial distribution of the radical generation, it is necessary to have the radial distribution in gas density in the vicinity of the ECR surface which is a radical generation region. For example, when it is desired to increase desired radicals at an outer circumferential portion of the wafer, it is useful to supply a gas from the outer circumference to generate the desired radicals when dissociation is performed. In this case, it is desirable that a direction in which the gas is blown out from the outer circumference is not a directed toward the center side of the apparatus so that the radicals generated by the gas supplied from the outer circumference are supplied to the outer circumference of the wafer.

Herein, PTL 2 discloses a configuration in which the gas from the outer circumference is supplied obliquely downward from a ring-shaped member at an outer circumferential portion of the apparatus, and PTL 3 discloses a configuration in which a gas flow path is formed in a space between the shower plate and a dielectric window, but PTLs 2 and 3 all have technical problems. Hereinafter, the technical problems in the respective configurations will be described.

First, in the configuration disclosed in PTL 2 in which the gas supplied from the outer circumference flows through a gap between a gas introduction ring and a ring cover, the technical problem occurs both in a case where the gap is wide and in a case where the gap is narrow. Specifically, when the gap is wide, a flow velocity of the gas blown out from the gap is lower, and therefore radicals generated in a processing chamber may diffuse and reach the gap.

That is, in a case where gas such as CxFy, CHxFy, and SiClx are used as the supplied gas, in which the radicals with a strong deposition property are generated when the dissociation is performed, and in a case where a reaction product with strong adhesion is generated, the radical or reaction product having the deposition property may adhere to the gap.

In general, radicals or reaction products excessively deposited on an inner wall of the apparatus may peel off and adhere to the wafer as particles. When the particles adhere to the wafer, a yield during semiconductor device manufacturing is reduced. Therefore, after the wafer processing, it is necessary to generate plasma using cleaning gas such as $SF_6/O_2$ and clean the inner wall of the apparatus with ions or radicals.

However, although the cleaning by the plasma is effective in a region directly facing the plasma, cleaning is difficult in a region such as the gap where the ions or the radicals are difficult to reach sufficiently. When the cleaning is difficult, a risk of the particle adhering to the wafer increases, and a time required for the cleaning greatly increases.

Further, conductance of the gas changes over time because the radicals and the reaction products are deposited in the gap through which the gas passes. That is, when many wafers are continuously processed under the same processing condition, since a processing result changes over time, it is difficult to mass-produce semiconductor devices of the same level.

On the other hand, when the gap between the gas introduction ring and the ring cover is narrow, since the gas flow velocity blown out from the gap is fast and the radicals and the reaction products generated in the processing chamber are less likely to be transported into the gap, it is easy to prevent adhesion of the radicals and the reaction products in the gap. However, when the gap is narrow, for a dimension of the gap, an effect of tolerance of the ring-shaped member and a human error in a mounting position is relatively large. When the gap in a circumferential direction is non-uniform, there is a problem that an amount of the blown-out gas to be supplied to the apparatus is non-uniform and the uniformity of the density distribution of the target radicals is hindered.

Further, an essential problem when the gas is supplied from the ring-shaped member on the outer circumference of the apparatus is that the gas is supplied from the outer circumference with a certain initial velocity in a direction toward the central axis of the apparatus. Therefore, the gas supplied from the outer circumference is mixed with the gas supplied from the shower plate and transported to the wafer. Therefore, even if desired gas is supplied from the outer circumference in order to supply a large amount of desired radicals to the outer circumferential portion of the wafer, the radicals are likely to be transported to the central portion of the wafer by the gas flow, and the intended supply is difficult to be performed.

Next, a technical problem of a configuration disclosed in PTL 3 in which a space between the shower plate and the dielectric window is divided into a central portion and an outer circumferential portion will be described. The configuration appears to be able to independently supply the gas from the central portion and the outer circumferential portion of the shower plate at a glance, but the fact is different. A fact that a practical function cannot be obtained with the configuration will be described below.

In the configuration disclosed in PTL 3, in order to form independent flow paths at the central portion and the outer circumferential portion in the space between the dielectric window and the shower plate, a partition portion protruding from the dielectric window is in close contact with the shower plate. In general, a pressure in the processing chamber is a vacuum of several Pa or less, which is suitable for plasma etching processing. On the other hand, a pressure in a gap between the shower plate and the dielectric window is several hundred Pa to several kPa.

At this time, the shower plate bends due to a pressure difference between front and back sides of the shower plate. When the shower plate bends, the close contact between the partition portion of the dielectric window and the shower plate may be impaired, and flow paths on the center side and the outer circumferential side may be connected between the dielectric window and the shower plate. As a result, even if the gas is supplied independently at the center and the outer circumference, the gas is supplied from the shower plate to the processing chamber in a mixed state, and it is difficult to supply the gas independently.

The invention has been made in view of such technical problems, and an object of the invention is to provide a plasma processing apparatus capable of adjusting density distribution of radicals and reaction products on a wafer by using two shower plates provided with gas holes.

Solution to Problem

In order to solve the above-described technical problems, one of representative plasma processing apparatuses according to the invention includes a processing chamber in which a sample is processed by plasma, a radio frequency power supply configured to supply radio frequency power for generating plasma, a dielectric plate disposed above the processing chamber to hermetically seal the processing chamber, a first gas supply plate disposed below the dielectric plate and configured to supply first gas into the processing chamber, and a sample stage on which the sample is placed, the plasma processing apparatus further includes a second gas supply plate disposed below the first gas supply plate and configured to supply second gas into the processing chamber. In the first gas supply plate, a plurality of first gas holes are formed penetrating a first region, in the second gas supply plate, a plurality of second gas holes are formed penetrating a second region, in a space between the dielectric plate and the first gas supply plate, the first gas is supplied by a first gas supply unit, in a space between the first gas supply plate and the second gas supply plate, the second gas is supplied by a second gas supply unit, the first region is a region of a central portion of the first gas supply plate, and the second region is a region that includes the first region and is wider than the first region.

Advantageous Effect

According to the invention, it is possible to provide a plasma processing apparatus capable of adjusting density distribution of radicals and reaction products on a wafer by using two shower plates provided with gas holes.

Technical problems, configurations, and effects other than those described above will be clarified by description of the following embodiments.

BRIEF DESCRIPTION OF DRAWINGS

FIG. 1 is a cross-sectional view of a plasma etching apparatus according to a first embodiment of the invention.

FIG. 2A is a diagram showing a flow velocity pattern in the plasma etching apparatus according to the first embodiment of the invention.

FIG. 2B is a diagram showing a flow velocity pattern in the plasma etching apparatus according to the first embodiment of the invention.

FIG. 3 is a cross-sectional view of a plasma etching apparatus according to a second embodiment of the invention.

FIG. 4 is an enlarged cross-sectional view of a dielectric window and shower plates according to the second embodiment of the invention.

FIG. 5A is a diagram showing a structural model of the shower plate according to the second embodiment of the invention.

FIG. 5B is a diagram showing a structural model of the shower plate according to the second embodiment of the invention.

FIG. 6 is an equivalent circuit diagram of a gas flow according to the second embodiment of the invention.

FIG. 7 is an enlarged cross-sectional view of outer circumferential portions of a dielectric window and shower plates according to a third embodiment of the invention.

FIG. 8A is a bottom view of the dielectric window according to the third embodiment of the invention.

FIG. 8B is a bottom view of an upper shower plate according to the third embodiment of the invention.

FIG. 9 is an enlarged cross-sectional view of outer circumferential portions of a dielectric window and shower plates according to another embodiment.

FIG. 10 is an enlarged cross-sectional view of outer circumferential portions of a dielectric window and shower plates according to another embodiment.

FIG. 11 is an enlarged cross-sectional view of outer circumferential portions of a dielectric window and shower plates according to another embodiment.

DESCRIPTION OF EMBODIMENTS

Hereinafter, embodiments of the invention will be described with reference to the drawings. It should be noted that in the present specification, an "upper" side refers to a side farther from a substrate to be processed along a normal line extending from a surface to be processed of the substrate to be processed without passing through an inside of the substrate, and a "lower" side refers to a side close to the substrate to be processed along the normal line. Further, a central axis of an apparatus passes through a center of the substrate to be processed.

First Embodiment

FIG. 1 is a cross-sectional view of a plasma etching apparatus according to a first embodiment of the invention. A microwave oscillated from a microwave source 1 is transmitted to a circular waveguide 6 via a rectangular waveguide 2, an automatic matching device 3, an isolator 4, and a circular-rectangular converter 5. In the present embodiment, a magnetron of 2.45 GHz, which is often used as an industrial frequency, is used as the microwave source 1. However, the present embodiment is not limited to the frequency, and electromagnetic waves of several tens of MHz to several tens of GHz may be used.

The automatic matching device 3 has a function of adjusting load impedance, controlling a reflected wave, and efficiently supplying the electromagnetic wave. Further, the isolator 4 is used to protect the microwave source 1 from the reflected wave. It is preferable to select the circular waveguide 6 having a diameter that propagates only a circular TE11 mode, which is a fundamental mode. Accordingly, when a high-order mode is included, it is possible to prevent stability and uniformity of plasma generation from being adversely affected. The circular waveguide 6 is connected to a cavity 7, and the cavity 7 has a function of adjusting electromagnetic field distribution to a distribution suitable for plasma processing.

An electromagnetic coil 8 is provided around a plasma processing chamber (also simply referred to as a processing chamber) 100, and a yoke 9 is provided on an outer circumference of the electromagnetic coil 8. By supplying a current to the electromagnetic coil 8, static magnetic field distribution is adjusted so as to satisfy a magnetic flux density required for ECR in the plasma processing chamber 100. The yoke 9 functions as a magnetic shield for preventing leakage of the magnetic field to an outside of the apparatus.

Magnetic force lines formed by the electromagnetic coil 8 and the yoke 9 form a diffusion magnetic field that spreads from an upper side to a lower side in the plasma processing chamber 100 in an outer circumferential direction. When the microwave is 2.45 GHz, the magnetic flux density required for ECR is 875 G. By adjusting the static magnetic field distribution, an 875 G isomagnetics field surface (ECR surface) is adjusted freely to a location in a discharge chamber, and thus a position of a generation region of plasma 101 can be adjusted. Further, diffusion of the plasma to a substrate to be processed (sample) 10 can be controlled by adjusting the static magnetic field. Therefore, it is desirable to use a plurality of electromagnetic coils 8 in order to easily control the generation region of the plasma and the diffusion of the plasma.

In a lower portion of the cavity 7, a circular plate-shaped microwave introduction window (also referred to as a dielectric plate) 11 that hermetically seals the plasma processing chamber 100, an upper shower plate (first gas supply plate) 12, a lower shower plate (second gas supply plate) 13, and an inner cylinder 14 are disposed in this order from an upper side. As materials of the microwave introduction window 11, the upper shower plate 12, and the lower shower plate 13, it is preferable to use quartz which transmits the microwave efficiently and has excellent plasma resistance.

Alternatively, yttria, alumina, yttrium fluoride, aluminum fluoride, aluminum nitride, or the like, which are materials that has high plasma resistance and transmit the microwave, may be used as the materials of the microwave introduction window 11, the upper shower plate 12, and the lower shower plate 13.

The inner cylinder 14 is not necessarily required to transmit the microwave, but needs to have the plasma resistance from a viewpoint of controlling a particle and contamination on a wafer caused by sputtering or the like of the inner cylinder 14. Therefore, for example, quartz is preferably used as the material of the inner cylinder 14, whereas yttria, alumina, yttrium fluoride, aluminum fluoride, aluminum nitride, or the like may be used. The inner cylinder 14 and a chamber inner wall 25 (to be described later) constitute a vacuum chamber.

First gas is supplied from a first gas supply unit 15 to a space between the microwave introduction window 11 and the upper shower plate 12. Further, second gas is supplied from a second gas supply unit 16 to a space between the upper shower plate 12 and the lower shower plate 13. A function of independently supplying gas with a desired flow rate by, for example, a mass flow controller (control device) is provided for the first gas supply unit 15 and the second gas supply unit 16. Further, a function of supplying a plurality of types of gas in combination at a predetermined flow rate is provided for the first gas supply unit 15 and the second gas supply unit 16. A plurality of gas holes (first gas holes) 12p are formed in the upper shower plate 12, a plurality of gas holes (second gas holes) 13p are formed in the lower shower plate 13, and gas to be processed is supplied to the plasma processing chamber 100 via the gas holes 12p and 13p.

In the plasma processing chamber 100, a substrate stage and radio frequency electrode (sample stage) 17 on which a to-be-processed substrate 10 disposed to face the lower shower plate 13 is placed, and an insulating plate 18 disposed below the substrate stage and radio frequency electrode 17 are provided.

The gas supplied into the plasma processing chamber 100 from the first gas supply unit 15 and the second gas supply unit 16 is vacuum-exhausted to the outside from a lower part of the plasma processing chamber 100 by a turbo molecular pump 20 via a conductance adjustment valve 19.

Further, in order to supply bias power (radio frequency power) to the to-be-processed substrate 10, a bias power supply (radio frequency power supply) 22 is connected to the substrate stage and radio frequency electrode 17 via a bias automatic matching device 21. In the present embodiment, a frequency of 400 kHz is used as a frequency of the bias power supply, but other frequencies, for example, 13.56 MHz of the industrial frequency, may be used in accordance with a purpose required for plasma etching processing.

Further, the substrate stage and radio frequency electrode 17 is provided with a temperature adjustment unit and a unit that adsorbs the to-be-processed substrate 10 to the substrate stage and radio frequency electrode 17, which are not shown, and a temperature of the to-be-processed substrate 10 is adjusted as necessary such that desired etching processing can be performed.

In order to protect the substrate stage and radio frequency electrode 17, a susceptor 23 made of a dielectric material and a covering 24 are disposed on an outer circumferential portion of an upper surface and a side surface of the substrate stage and radio frequency electrode 17. For example, as materials of the susceptor 23 and the covering 24, it is preferable to use quartz having high plasma resistance. Alternatively, as materials having high plasma resistance, yttria, alumina, yttrium fluoride, aluminum fluoride, aluminum nitride, or the like may be used as the materials of the susceptor 23 and the covering 24.

The lower part of the plasma processing chamber 100 is surrounded by the grounded chamber inner wall 25 made of a conductive material. The etching processing is performed such that the first gas and the second gas supplied to the plasma processing chamber 100 are converted into plasma to generate the plasma 101 by the microwave supplied from the microwave source 1, and generated ions and radicals are emitted to the to-be-processed substrate 10.

Next, configurations and effects of the upper shower plate 12 and the lower shower plate 13 will be described. Conductance of each of the gas holes 12p of the upper shower plate 12 is disposed to be smaller than conductance of each of the gas holes 13p of the lower shower plate 13. This is because when the second gas is supplied from the second gas supply unit 16, the second gas can be prevented from flowing back to the space between the microwave introduction window 11 and the upper shower plate 12 or to the first gas supply unit 15 through the gas holes of the upper shower plate 12, and the second gas is effectively supplied to the plasma processing chamber 100. In order to reduce the conductance of the gas holes, any method such as a reduction in the gas hole diameter and a reduction in the number of gas holes can be used.

A range in which the gas holes of the upper shower plate 12 are disposed is concentrated in the vicinity of a central axis X of the apparatus than the lower shower plate 13. That is, the plurality of gas holes 12p of the upper shower plate 12 are formed so as to penetrate only in a region in the vicinity of the center (first region), and the plurality of gas holes 13p of the lower shower plate 13 are formed so as to penetrate not only in the vicinity of the center but also in a region that spreads radially outward than the gas holes 12p (second region).

An effect of an arrangement of the gas holes will be described. FIG. 2A shows a flow of the gas in the plasma processing chamber 100 in a pattern with arrows when a flow ratio between the first gas and the second gas is 95:5. A direction of the arrow shows a direction of a flow velocity, and it means that the flow velocity is large in a region where a length and a thickness of the arrow are large. According to FIG. 2A, it can be seen that a large amount of gas is supplied to the vicinity of the central axis X of the apparatus, and a downward high-speed gas flow is formed.

On the other hand, FIG. 2B shows a flow of the gas in the plasma processing chamber 100 in a pattern with arrows when the flow ratio between the first gas and the second gas is 5:95. According to FIG. 2B, it can be seen that a flow of the gas in a radial direction in the apparatus is relatively gentle and is substantially uniform.

As can be seen from the above, by controlling the first gas supply unit 15 and the second gas supply unit 16 using the mass flow controller (not shown) to adjust the flow ratio between the first gas and the second gas, flow velocity distribution in the apparatus can be adjusted as described above. A preferable gas pressure is 0.1 to several Pa, and a preferable gas flow velocity is 10 to 2000 ccm. The pressure and a total flow rate can be freely changed and adjusted to a desired flow velocity pattern. The reason why the flow velocity can be effectively adjusted in the present embodiment is that the region of the gas holes 12p of the upper shower plate 12 is concentrated in the vicinity of the central axis X of the apparatus, and the arrangement range of the gas holes 13p of the lower shower plate 13 is larger than that of the upper shower plate 12 (protruding radially outward).

A method of adjusting CD distribution by adjusting the gas flow velocity will be described. For example, when a reaction product having a deposition property is generated by the plasma etching processing, the reaction product may re-attach to a pattern side wall, and the CD may increase. In such a case, when the flow rate of the first gas is increased as compared with the second gas, the gas flow velocity in the vicinity of the central axis X of the apparatus increases, as a result, the reaction product at a central portion of the wafer is transported in an exhaust direction, and a reaction product density at the central portion of the wafer is reduced. Therefore, re-attachment of the reaction product at the center of the wafer is controlled, and the CD at the central portion of the wafer is reduced.

In contrast, when the flow rate of the second gas is increased as compared with the flow rate of the first gas, the reaction product density at the central portion of the wafer increases, so that the CD at the center of the wafer increases. As can be seen from the above, the flow ratio between the first gas and the second gas can be adjusted to make the CD distribution uniform.

Second Embodiment

Next, a second embodiment which is different in terms of the upper shower plate 12 and the lower shower plate 13 in a plasma etching apparatus will be described. FIG. 3 is a cross-sectional view of an apparatus according to the present embodiment. The same configurations as those of the above-described embodiment are denoted by the same reference numerals, and repetitive descriptions thereof will be omitted.

As shown in FIG. 3, in the lower shower plate 13, a plurality of gas holes are disposed in regions of a central portion and an outer circumferential portion. On the other hand, on a lower surface of the upper shower plate 12, an annular projection 12a is provided serving as a partition portion that divides a space between the upper shower plate 12 and the lower shower plate 13 into a center side and an outer circumferential side. By the projection 12a, the space between the upper shower plate 12 and the lower shower plate 13 is partitioned into a first space which is on the center side and faces a space between the microwave introduction window 11 and the upper shower plate 12, and a second space which is on the circumferential side and is located on an outer side than the first space. A lower surface of the projection 12a is disposed so as to be in close contact with an upper surface of the lower shower plate 13. The projection 12a has a function of preventing first gas and second gas from mixing before reaching the plasma processing chamber 100.

In addition to the central gas holes 13p, the lower shower plate 13 includes a plurality of surrounding gas holes (third gas holes) 13q communicating with the second space. A sum of conductance of the respective first gas holes 12p is smaller than a sum of conductance of the respective second gas holes 13p.

Referring to FIG. 4, the first gas supplied from the first gas supply unit 15 is supplied to the space between the microwave introduction window 11 and the upper shower plate 12, then passes through the gas holes 12p of the upper shower plate 12, and is further supplied to the plasma processing chamber 100 from the gas holes 13p at the central portion of the lower shower plate 13. Further, the second gas supplied from the second gas supply unit 16 is supplied to the space between the upper shower plate 12 and the lower shower plate 13, and then is supplied to the plasma processing chamber 100 through the gas holes 13q on the outer circumferential side of the lower shower plate 13 without being mixed with the first gas due to the partition of the projection 12a. It is preferable that the sum of the conductance of the gas holes formed in the upper shower plate 12 is smaller than the sum of the conductance of the gas holes formed at the central portion of the lower shower plate 13. Accordingly, the gas can be prevented from being flowing back.

An example of a method of adjusting CD distribution using the configuration will be described. For example, as a result of plasma etching processing, a CD may be large at a central portion of a wafer and small at an outer circumferential portion. At this time, as the first gas, it is preferable to supply a gas type that generates radicals serving as an etchant in the vicinity of the central portion, and as the second gas, it is preferable to supply a gas type that generates radicals having a deposition property to an outer circumferential side. Accordingly, the CD can be reduced at a central portion side of the wafer and the CD can be increased at an outer circumferential portion side, and therefore the CD distribution can be adjusted to be uniform as a whole. However, the method is an example, and the types and flow rates of the first gas and the second gas can be appropriately adjusted in order to ensure processing uniformity.

As described above, there is a possibility that independent gas flow paths in the central portion and the outer circumferential portion may be connected due to bending of the shower plate when the gas is supplied. Correspondingly, in the present embodiment, the apparatus has a configuration in which the gas flow paths in the central portion and the outer circumferential portion are prevented from being connected when the gas is supplied. Such an apparatus configuration will be described below.

According to a configuration of FIG. 3, when the first gas is supplied from the first gas supply unit 15, a central portion of the lower shower plate 13 bends toward a plasma processing chamber 100 side due to a gas pressure. However, at this time, if the upper shower plate 12 is also bent as much as or more than the lower shower plate 13, the close contact between the projection 12a of the upper shower plate 12 and the lower shower plate 13 is always maintained. In order to ensure the close contact, there are conditions related to thickness of the upper shower plate 12 and the lower shower plate 13, the conductance of the gas holes, and the like, and it is preferable to appropriately select parameters of such conditions.

A condition for maintaining the close contact between the projection 12a of the upper shower plate 12 and the lower shower plate 13 will be discussed below. First, when the second gas is supplied from the second gas supply unit 16, a pressure increases in a space on the outer circumferential side between the upper shower plate 12 and the lower shower plate 13. At this time, since a portion where the pressure is applied is in the vicinity of the outer circumference of the shower plate which can be regarded as a fixed end, there is almost no bending, and the close contact between the projection 12a of the upper shower plate 12 and the lower shower plate 13 can be ensured.

Therefore, regarding the above-mentioned close contact, a dimension, a shape, and the number of gas holes in the outer circumferential portion of the lower shower plate 13 are not particularly limited, and can be determined freely. However, when a gas hole diameter is large, an unintended discharge may occur in the gas hole, so it is desirable that the gas hole diameter is smaller than or equal to 1 mm. Further, it is desirable to arrange a plurality of gas holes in a circumferential direction so as to ensure uniform supply of the gas in the circumferential direction.

On the other hand, when the gas is supplied from the first gas supply unit 15, a pressure increases at a central portion of the space between the upper shower plate 12 and the lower shower plate 13, and the shower plate may bend and lose close contact. Therefore, when the gas is supplied from the first gas supply unit 15, a condition for maintaining the close contact between the projection 12a of the upper shower plate 12 and the lower shower plate 13 will be discussed.

FIG. 4 is an enlarged view of the vicinity of the microwave introduction window 11, the upper shower plate 12, and the lower shower plate 13. Herein, a pressure between the microwave introduction window 11 and the upper shower plate 12 is set to $P_2$, a radius of the space at a central portion between the upper shower plate 12 and the lower shower plate 13 is set to c, and a pressure therein is set to $P_1$. It should be noted that since a pressure in the processing chamber is sufficiently smaller than $P_1$ and $P_2$, the pressure is 0.

FIGS. 5A and 5B show structural models of the shower plates. Approximately, the upper shower plate 12 and the lower shower plate 13 are considered to be simple disks each having a radius R with the outer circumference being the fixed end and a uniform distribution load applied to an upper surface.

FIG. 5A shows a structural model of the upper shower plate 12. For the sake of simplicity, a uniform distribution load ($P_2-P_1$) is applied to the entire upper surface of the upper shower plate 12.

FIG. 5B shows a structural model of the lower shower plate 13. A uniform distribution load $P_1$ is applied to the upper surface of the lower shower plate 13 at a radius (distance from the center) r≤c. By such simplification, an amount of bending can be analytically derived (reference: Timoshenko et al., Theory of plates and shells, 2nd edition, McGRAWHILL BOOK COMPANY).

The condition for ensuring the adhesion between the annular projection 12a of the upper shower plate 12 and the lower shower plate 13 is that bending $w_2$ of the upper shower plate 12 is equal to or larger than bending $w_1$ of the lower shower plate 13 at r=c (Equation (1)).

[Math 1]

$$w_1 \leq w_2 \text{(WHEN } r=c\text{)} \tag{1}$$

The bending at r=c of the disk to which the uniform distribution load $P_1$ is applied at r≤c is given by the following equation.

[Math 2]

$$w_1 = \frac{P_1 c^2}{8D_1}\left(\left(\ln\frac{c}{R} - \frac{c^2}{4R^2}\right) \cdot c^2 + \frac{c^2}{2} \cdot \ln\frac{c}{R} - \frac{3c^2}{8} + \frac{R^2}{2}\right) \tag{2}$$

Herein, $D_1$ is bending stiffness of the lower shower plate 13, and is shown by the following equation.

[Math 3]

$$D_1 = \frac{E_1 L_1^3}{12(1-v_1^2)} \tag{3}$$

$E_1$, $v_1$, and $L_1$ show a Young's modulus, a Poisson's ratio, and a thickness of the lower shower plate 13, respectively.

Next, the bending of the disk on which the uniform distribution load ($P_2-P_1$) is applied to the entire surface is given at r=c by the following equation.

[Math 4]

$$w_2 = \frac{P_2 - P_1}{64D_2}(R^2 - c^2)^2 \tag{4}$$

Herein, $D_2$ is the bending stiffness of the upper shower plate 12, and is shown by the following equation.

[Math 5]

$$D_2 = \frac{E_2 L_2^3}{12(1-v_2^2)} \tag{5}$$

$E_2$, $v_2$, and $L_2$ show a Young's modulus, a Poisson's ratio, and a thickness of the upper shower plate 12, respectively. In the present embodiment, materials of the upper shower plate 12 and the lower shower plate 13 are both quartz. Therefore, $E_1=E_2$ and $v_1=v_2$.

Next, a relational expression between $P_1$ and $P_2$ is obtained. FIG. 6 shows an equivalent circuit of the gas flow. The gas is supplied at a predetermined flow rate Q from the first gas supply unit, and the gas is supplied to the plasma processing chamber via a flow path resistance $R_2$ of the gas holes of the upper shower plate 12 and a flow path resistance $R_1$ of the gas holes of the lower shower plate 13.

The flow path resistances $R_1$ and $R_2$ of the gas holes in the upper shower plate 12 and the lower shower plate 13 are given by the following equations.

[Math 6]

$$R_1 = \frac{1}{n_1 C_1} \tag{6}$$

$$R_2 = \frac{1}{n_2 C_2} \tag{7}$$

Herein, $n_1$ represents the number of gas holes in the central portion of the lower shower plate, $n_2$ represents the number of gas holes in the upper shower plate, and $C_1$ and $C_2$ represent the conductance per gas hole in the upper shower plate and the lower shower plate. The flow rate Q is given by the following equation.

[Math 7]

$$Q = \frac{P_2 - P_1}{R_2} = \frac{P_1}{R_1} \tag{8}$$

When the gas type is air, the gas flow is viscous, and the shape of the gas hole is a cylinder, the conductance is given by the following equation.

[Math 8]

$$C = 1349\frac{d^4}{L} \cdot \frac{P_A + P_B}{2} \tag{9}$$

Herein, d represents the gas hole diameter, L represents a length of the gas hole, and $P_A$ and $P_B$ represent pressures at an inlet and an outlet of the gas hole, respectively. When the gas hole diameter of the lower shower plate 13 is set to $d_1$ and the gas hole diameter of the upper shower plate 12 is set to $d_2$, the conductance $C_1$ and $C_2$ of the lower shower plate 13 and the upper shower plate 12 can be represented by the following equations.

[Math 9]

$$C_1 = 1349 \frac{d_1^4}{L_1} \cdot \frac{P_1}{2} \tag{10}$$

$$C_2 = 1349 \frac{d_2^4}{L_2} \cdot \frac{P_1 + P_2}{2} \tag{11}$$

The following equation is obtained from Equations (6), (7), (8), (10) and (11).

[Math 10]

$$P_2 = \sqrt{1 + \frac{L_2 n_1 d_1^4}{L_1 n_2 d_2^4}} P_1 \tag{12}$$

The following relational expression is obtained based on Equations (1) to (5) and Equation (12).

[Math 11]

$$\sqrt{\frac{L_2 n_1 d_1^4}{L_1 n_2 d_2^4}} \left(\frac{L_2}{L_1}\right)^3 \left(1 - \left(\frac{c}{R}\right)^2\right)^2 - \tag{13}$$

$$12\left(\frac{c}{R}\right)^4 \ln\frac{c}{R} + 2\left(\frac{c}{R}\right)^6 + 3\left(\frac{c}{R}\right)^4 - 4\left(\frac{c}{R}\right)^2 \geq 0$$

Various specifications may be determined so as to satisfy such a relational expression. For example, in a specification in which L1=L2=5 mm, R=200 mm, c=25 mm, d1=0.5 mm, d2=0.7 mm, n2 is set to 50, and $n_1$ is set to 150, a left side of Equation (13) is 0.8, and the relational expression of Equation (13) is satisfied. That is, it can be seen that the close contact between the projection 12a of the upper shower plate 12 and the lower shower plate 13 is maintained in the above-described specification.

In the above-described model, the shape of the gas hole of the shower plate is a cylinder, whereas the shape may be a divergent nozzle shape or a Laval nozzle shape. Approximately, a minimum diameter of the shape of the gas hole may be substituted and used as $d_1$ and $d_2$ in Equation (13).

In the present embodiment, Equation (13) is derived when the same material is used for the upper shower plate 12 and the lower shower plate 13, and when different kinds of materials are used, the condition for ensuring the close contact between the projection 12a of the upper shower plate 12 and the lower shower plate 13 can be derived in a similar method using the Young's modulus and the Poisson's ratio.

Third Embodiment

Next, a specific configuration of outer circumferential portions of the microwave introduction window 11, the upper shower plate 12, and the lower shower plate 13 suitable for the configuration according to the first embodiment or the second embodiment will be described. FIG. 7 is an enlarged view of the outer circumferential portions of the microwave introduction window 11, the upper shower plate 12, and the lower shower plate 13. Three O-rings 27 are disposed on an annular head piece (support member) 26 that supports the outer peripheries of the microwave introduction window 11, the upper shower plate 12, and the lower shower plate 13.

The outer circumferential portions of the microwave introduction window 11, the upper shower plate 12, and the lower shower plate 13 are placed on the O-rings 27, respectively. Herein, since an outer diameter of the microwave introduction window 11 is larger than an outer diameter of the upper shower plate 12 and the outer diameter of the upper shower plate 12 is larger than an outer diameter of the lower shower plate 13, lower surfaces of the outer circumferential portions can be supported by the head piece 26 which is a single member, via the O-rings 27.

A function of each of the O-rings 27 will be described. The O-ring 27 located immediately below the outer circumferential portion of the microwave introduction window 11 is disposed to ensure sealing performance with an atmosphere. The O-ring 27 immediately below the outer circumferential portion of the upper shower plate 12 is disposed such that first gas and second gas do not mix. Further, the O-ring 27 immediately below the outer circumferential portion of the lower shower plate 13 is disposed to prevent the second gas from leaking from between the lower shower plate 13 and the head piece 26 to the plasma processing chamber 100.

In the head piece 26, a gas flow path through which the first gas and the second gas pass is formed. In order to supply the gas uniformly in a circumferential direction, a plurality of the gas flow paths may be provided in the circumferential direction.

FIG. 8A is a view of the microwave introduction window 11 viewed from a lower surface side, and FIG. 8B is a view of the upper shower plate 12 viewed from a lower surface lower side. In a center of a lower surface of the microwave introduction window 11 and a lower surface of the upper shower plate 12, a circular recess portion 11a and a circular recess portion 12b are respectively formed, and in the lower surface in the vicinity of the outer circumference, a circumferential groove 11b and a circumferential groove 12c that are connected to the gas flow path of the headpiece 26 are respectively formed. The first gas flows in the circumferential groove lib, and the second gas flows in the circumferential groove 12c.

An inner annular portion 11c is formed between the circular recess portion 11a and the circumferential groove 11b, and an inner annular portion 12d is formed between the circular recess portion 12b and the circumferential groove 12c. Further, an outer annular portion 11d is formed adjacent to and radially outside the circumferential groove lib, and an outer annular portion 12e is formed adjacent to and radially outside the circumferential groove 12c. Lower surfaces of the outer annular portions 11d and 12e, which are the outer circumferential portions, are sealing surfaces with the O-rings 27.

As shown in FIG. 7, the inner annular portion 11c of the microwave introduction window 11 has a function of pressing the upper shower plate 12. Further, similarly, the inner annular portion 12d of the upper shower plate 12 has a function of pressing the lower shower plate 13. Accordingly, the O-ring 27 is elastically deformed to obtain the sealing performance of the gas, and the gas can be prevented from flowing out to an unintended portion. Further, positions of the upper shower plate 12 and the lower shower plate 13 can be prevented from being shifted due to a gas pressure.

As shown in FIG. 8A, a plurality of grooves 11e extending in the radial direction are formed in the inner annular portion 11c. Accordingly, the circular recess portion 11a and the circumferential groove 11b communicate with each other. Further, as shown in FIG. 8B, a plurality of grooves 12f extending in the radial direction are formed in the inner annular portion 12d. Accordingly, the circular recess portion 12b and the circumferential groove 12c communicate with each other.

The plurality of grooves 11e and 12f provided in the inner annular portions 11c and 12d have a function of making the first gas and the second gas that has reached the circumferential grooves 11b and 12c, flow into the gas holes of the shower plates, respectively. In order to distribute the gas evenly in a circumferential direction, it is desirable that there are the plurality of grooves along the circumferential direction. In the present embodiment, eight grooves 11e and eight grooves 12f are disposed on the inner annular portions 11c and 12d in the circumferential direction, respectively.

With reference to FIG. 9, another example of the outer circumferential portions of the microwave introduction window 11, the upper shower plate 12, and the lower shower plate 13 will be described. In the present example, with respect to the configuration of FIG. 7, a step 13a is provided on an upper side of the outer circumferential surface of the lower shower plate 13. The second gas supplied from the second gas supply unit 16 can spread in the circumferential direction along an annular space (second space) defined by the step 13a and the head piece 26, and can be uniformly guided to the gas holes of the lower shower plate 13 in the circumferential direction. Other configurations are similar to those in the above-described example, and repetitive descriptions thereof will be omitted.

Similar to the lower shower plate 13, a step may also be provided on an upper side of the outer circumferential surface of the upper shower plate 12. Further, in order to distribute the gas uniformly in the circumferential direction, a groove or a step portion for distributing gas in the circumferential direction may be provided in the headpiece 26. In the present embodiment, the step 13a that forms the annular space having a rectangular cross section is provided, but a shape of the step is freely set.

With reference to FIG. 10, another example of the outer circumferential portions of the microwave introduction window 11, the upper shower plate 12, and the lower shower plate 13 will be described. In the present example, with respect to the configuration of FIG. 7, the O-ring immediately below the outer circumferential portion of the lower shower plate 13, the circumferential groove and the annular portion of the upper shower plate 12 are omitted, and the entire lower surface of the lower shower plate 13 is set to be on the same plane. That is, only the lower surfaces of the outer circumferential portions of the microwave introduction window 11 and the upper shower plate 12 are supported by the head piece 26 via the O-rings 27. Other configurations are similar to those in the above-described example, and repetitive descriptions thereof will be omitted.

In general, an inside of a plasma processing chamber is a vacuum, and a pressure in a space between the upper shower plate 12 and the lower shower plate 13 is higher than that in the plasma processing chamber. Due to a pressure difference, the head piece 26 and the lower surface of the outer circumferential portion of the lower shower plate 13 are in close contact with each other even the lower shower plate 13 is not pressed by the annular portion of the upper shower plate 12. Therefore, the O-ring immediately below the outer circumferential portion of the lower shower plate 13 can be omitted. Accordingly, shapes of the upper shower plate 12 and the lower shower plate 13 can be simple disks, and manufacture is easy.

Another example of the outer circumferential portions of the microwave introduction window 11, the upper shower plate 12, and the lower shower plate 13 will be described with reference to FIG. 11. According to the present example, with respect to the configuration of FIG. 7, in an upper part of the outer circumferential surface of the lower shower plate 13, the step 13a having a relatively large width in the radial direction is formed, and a ring-shaped spacer 28 that abuts the upper shower plate 12 and the lower shower plate 13 is provided so as to be accommodated in the step 13a.

The examples in FIGS. 10 and 11 are useful structures when it is desired to optically monitor a state in the processing chamber from an atmosphere side above the microwave introduction window 11. In order to monitor the state in the plasma processing chamber 100 from outside the apparatus with an optical camera, the microwave introduction window 11, the upper shower plate 12, and the lower shower plate 13 need to be transparent. Therefore, a case where quartz is used for the microwave introduction window 11, the upper shower plate 12, and the lower shower plate 13 will be discussed.

In general, a surface roughness is increased and a light is diffusely reflected and make the surface opaque by simply cutting quartz, and therefore additional transparentizing processing is necessary. Methods for making quartz transparent can be broadly classified into mechanical polishing and fire polishing that melts the surface with a flame. In the mechanical polishing, when a target is a simple flat surface, good flatness can be implemented, but it is difficult to polish a recess surface having a circumferential groove or a step.

On the other hand, in a case of transparentizing by the fire polishing, the member is deformed due to heat, so that there is a technical problem that surface accuracy tends to be deteriorated. However, the microwave introduction window 11 generally has a thickness of 30 mm or more in order to have strength enough to withstand an atmospheric pressure. When the member is thick as described above, an amount of deformation due to heat is small, even when the fire polishing is performed, the flatness can be 50 μm or less, and transparentizing can be implemented while ensuring a low tolerance that is acceptable for an industrial product.

On the other hand, the shower plate is often thinned to 10 mm or less by laser processing such that the gas holes can be easily formed. When the member is thinned as described above, an amount of deformation due to heat is large, so that the flatness after the fire polishing becomes rough as several hundreds of μm or more. Since a space between the upper shower plate 12 and the lower shower plate 13 is a flow path through which the gas passes, when the flatness is low, the space in which the gas flows is partially narrowed and the gas flow is deviated, which may not be allowed in plasma etching processing. Therefore, in order to make the upper shower plate 12 and the lower shower plate 13 transparent, it is desirable that mechanical polishing is performed. Correspondingly, in the configurations of FIGS. 10 and 11, the upper and lower surfaces of the upper shower plate 12 and the lower shower plate 13 are in a shape of a flat plate, and therefore the transparentizing can be performed by the mechanical polishing.

The invention is not limited to the embodiments described above, and includes various modifications. For example, the above-described embodiments have been described in detail for easy understanding of the invention, and the invention is not necessarily limited to one having all the configurations described above. Further, a part of the configurations of one embodiment can be replaced with configurations of other embodiments, and the configurations of one embodiment can be added to configurations of another embodiment. Further, a part of the configurations of each embodiment may be added to, deleted from, or replaced with another configuration.

INDUSTRIAL APPLICABILITY

The invention is suitable for a plasma processing apparatus that processes a sample on a substrate such as a semiconductor wafer by etching or the like.

REFERENCE SIGN LIST 1 microwave source, 2 rectangular waveguide, 3 automatic matching device, 4 isolator, 5 circular-rectangular converter, 6 circular waveguide, 7 cavity, 8 electromagnetic coil, 9 yoke, to-be-processed substrate, 11 microwave introduction window, 12 upper shower plate, 13 lower shower plate, 14 inner cylinder, 15 first gas supply unit, 16 second gas supply unit, 17 substrate stage and radio frequency electrode, 18 insulating plate, 19 conductance adjustment valve, 20 turbo molecular pump, 21 bias automatic matching device, 22 bias power supply, 23 susceptor, 24 covering, 25 chamber inner wall, 26 head piece, 27 O-ring, 28 spacer, 100 plasma processing chamber, 101 plasma

The invention claimed is:

1. A plasma processing apparatus comprising:
a processing chamber in which a sample is processed by plasma; a radio frequency power supply configured to supply radio frequency power for generating plasma;
a dielectric plate disposed above the processing chamber to hermetically seal the processing chamber;
a first gas supply plate disposed below the dielectric plate and configured to supply first gas into the processing chamber; and
a sample stage on which the sample is placed, wherein
the plasma processing apparatus further comprise a second gas supply plate disposed below the first gas supply plate and configured to supply second gas into the processing chamber,
in the first gas supply plate, a plurality of first gas holes are formed penetrating a first region,
in the second gas supply plate, a plurality of second gas holes are formed penetrating a second region,
in a space between the dielectric plate and the first gas supply plate, the first gas is supplied by a first gas supply unit,
in a space between the first gas supply plate and the second gas supply plate, the second gas is supplied by a second gas supply unit,
the first region is a region of a central portion of the first gas supply plate,
the second region is a region that includes a region facing the first region and is wider than the first region,
an outer diameter of the dielectric plate is larger than an outer diameter of the first gas supply plate, and
the outer diameter of the first gas supply plate is larger than an outer diameter of the second gas supply plate,
each of the dielectric plate and the first gas supply plate includes a lower surface side comprising
a circular recess portion to enclose a region of gas holes in the lower plate;
a circumferential first groove formed in an outer circumference region of the lower surface side and constructed to provide a gas flow path;
an inner annular portion formed between the circular recess portion and the circumferential first groove to contact and be supported by the lower plate;
an outer annular portion formed adjacent to and radially outside the first circumferential groove to contact a seal included in a support member; and
a plurality of second grooves extending in a radial direction and formed in the inner annular portion and through which the circular recess portion and the circumferential first groove communicate with each other.

2. The plasma processing apparatus according to claim 1, wherein
conductance of each of the second gas holes is larger than conductance of each of the first gas holes.

3. The plasma processing apparatus according to claim 1, further comprising:
a control device configured to, when a radial gas flow in the processing chamber is to be made substantially uniform, control the first gas supply unit and the second gas supply unit such that a flow rate of the second gas is larger than a flow rate of the first gas.

4. The plasma processing apparatus according to claim 1, wherein
a lower surface of an outer peripheral portion of each of the dielectric plate, the first gas supply plate, and the second gas supply plate is disposed on an annular support member via an O-ring.

5. The plasma processing apparatus according to claim 1, wherein
a lower surface of an outer peripheral portion of each of the dielectric plate and the first gas supply plate is disposed on an annular support member via an O-ring, and
a lower surface of an outer peripheral portion of the second gas supply plate is disposed so as to be in contact with the support member.

6. The plasma processing apparatus according to claim 1, wherein
materials of the first gas supply plate and the second gas supply plate are quartz.

\* \* \* \* \*